United States Patent
Bhatt et al.

(10) Patent No.: US 8,493,173 B2
(45) Date of Patent: Jul. 23, 2013

(54) METHOD OF CAVITY FORMING ON A BURIED RESISTOR LAYER USING A FUSION BONDING PROCESS

(75) Inventors: Ashwinkumar C. Bhatt, Endicott, NY (US); Norman A. Card, Lockwood, NY (US); Charles Buchter, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 285 days.

(21) Appl. No.: 13/082,444

(22) Filed: Apr. 8, 2011

(65) Prior Publication Data
US 2012/0256722 A1    Oct. 11, 2012

(51) Int. Cl.
*H01C 1/02* (2006.01)

(52) U.S. Cl.
USPC .......................................... 338/252; 338/314

(58) Field of Classification Search
USPC .................... 338/206, 252, 309, 314
See application file for complete search history.

(56) References Cited

U.S. PATENT DOCUMENTS

| | | | | |
|---|---|---|---|---|
| 4,368,252 A * | 1/1983 | Kakuhashi et al. | | 430/312 |
| 4,446,188 A * | 5/1984 | Patel et al. | | 428/138 |
| 4,517,546 A * | 5/1985 | Kakuhashi et al. | | 338/320 |
| 4,540,463 A * | 9/1985 | Kakuhashi et al. | | 216/16 |
| 4,870,746 A * | 10/1989 | Klaser | | 29/620 |
| 5,923,952 A | 7/1999 | Ismail et al. | | |
| 7,260,890 B2 | 8/2007 | White et al. | | |
| 7,297,875 B2 | 11/2007 | Lauriello | | |
| 2003/0201870 A1* | 10/2003 | Ikemoto et al. | | 338/206 |
| 2009/0258161 A1* | 10/2009 | Japp et al. | | 427/555 |
| 2009/0284342 A1* | 11/2009 | Tsukada | | 338/314 |
| 2012/0256722 A1* | 10/2012 | Bhatt et al. | | 338/252 |

* cited by examiner

*Primary Examiner* — James Harvey
(74) *Attorney, Agent, or Firm* — Mark Levy; Hinman, Howard & Katell, LLP

(57) ABSTRACT

A method of forming a buried resistor within a cavity for use in electronic packages using two glass impregnated dielectric layers, one with a clearance hole, the second with a resistor core, the clearance hole being placed over the resistor core and the assembly fusion bonded. The space remaining around the resistor core is filled with a soldermask material and the assembly is coated with metal. Thru-holes are drilled, cleaned, and plated and then the metal coating is etched and partially removed. The soldermask is then removed and a layer of gold plating is applied to the exposed metal surfaces. The use of glass impregnated dielectric layers and fusion bonding eliminates the fluorinated ethylene propylene resin (FEP) bleed problem associated with previous buried resistor cavity assemblies.

16 Claims, 2 Drawing Sheets

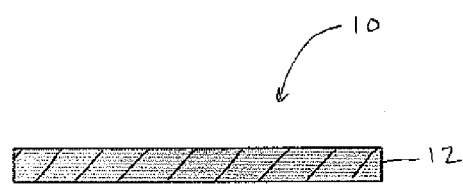
FIGURE 1a
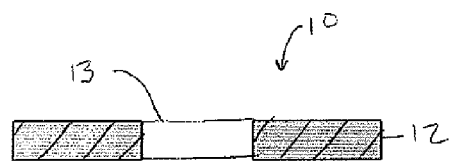
FIGURE 1b
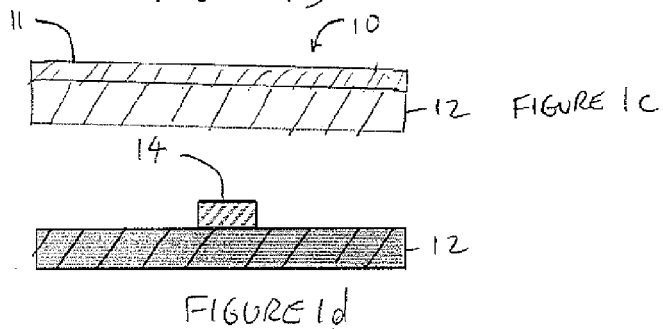
FIGURE 1c
FIGURE 1d
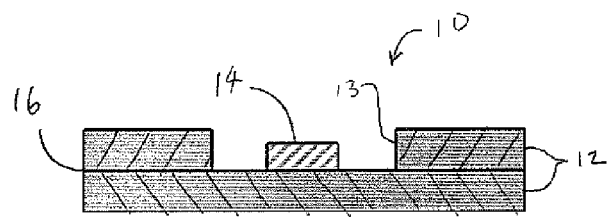
FIGURE 2
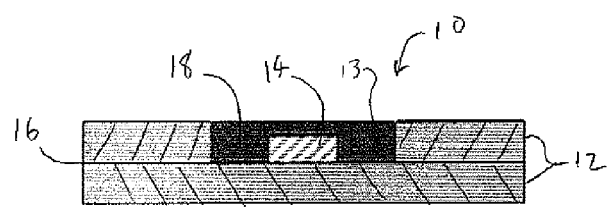
FIGURE 3

METHOD OF CAVITY FORMING ON A BURIED RESISTOR LAYER USING A FUSION BONDING PROCESS

FIELD OF THE INVENTION

This invention relates to buried resistor layers used in multilayered circuit boards, leadless chip carriers, and the like, and more particularly, to a process for manufacturing such cavities and for eliminating a fluorinated ethylene propylene (FEP) bleed problem associated with wire bondable cavity substrates.

BACKGROUND OF THE INVENTION

The needs of the semiconductor marketplace continue to drive density into semiconductor packages. Traditionally, greater wiring densities have been achieved by reducing the dimensions of vias, lines, and spaces, increasing the number of wiring layers, and utilizing blind and buried vias. However, each of these approaches, for example, those related to drilling and plating of high aspect ratio vias, reduced conductance of narrow circuit lines, and increased cost of fabrication related to additional wiring layers, includes inherent limitations.

PCBs, chip carriers and related products used in many of today's technologies must include multiple circuits in a minimum volume or space. Typically, such products comprise a "stack" of layers of signal, ground and/or power planes separated from each other by at least one layer of electrically insulating dielectric material. The circuit lines or pads (e.g., those of the signal planes) are often in electrical contact with each other by plated holes passing through the dielectric layers. The plated holes are often referred to as "vias" if internally located, "blind vias" if extending a predetermined depth within the board from an external surface, or "plated-thru-holes" (hereinafter also referred to simply as PTHs) if extending substantially through the board's full thickness. The term "thru-hole" as used herein is meant to include all three types of such board openings.

Complexity of these products has increased significantly in recent years. PCBs for mainframe computers may have as many as seventy-two layers of circuitry or more, with the complete stack having a thickness of as much as about 0.800 inch (800 mils). These boards are typically designed with three or five mil wide signal lines and twelve mil diameter thru-holes. Increased circuit densification requirements seek to reduce signal lines to a width of two mils or less and thru-hole diameters to two mils or less. Many known commercial procedures, especially those of the nature described herein, are incapable of economically forming these dimensions now desired by the industry. Such processes typically comprise fabrication of separate innerlayer circuits (circuitized layers), which are formed by coating a photosensitive layer or film over a copper layer of a copper clad innerlayer base material. The photosensitive coating is imaged and developed and the exposed copper is etched to form conductor lines. After etching, the photosensitive film is stripped from the copper, leaving the circuit pattern on the surface of the innerlayer base material. This processing is also referred to as photolithographic processing in the PCB art and further description is not deemed necessary.

After the formation of the individual innerlayer circuits, a multilayer stack is formed by preparing a lay-up of core innerlayers, ground planes, power planes, etc., typically separated from each other by a dielectric prepreg comprising a layer of glass (typically fiberglass) cloth impregnated with a partially cured material, typically a B-stage epoxy resin. The top and bottom outer layers of the stack usually comprise copper clad, glass-filled epoxy planar substrates with the copper cladding comprising the exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in the copper cladding using procedures similar to the procedures used to form the innerlayer circuits. A photosensitive film is applied to the copper cladding. The coating is exposed to patterned activating radiation and developed. An etchant is then used to remove copper bared by the development of the photosensitive film. Finally, the remaining photosensitive film is removed to provide the exterior circuit layers.

The aforementioned thru-holes (also often referred to as interconnects) are used in many such substrates to electrically connect individual circuit layers within the structure to each other and to the outer surfaces. The thru-holes typically pass through all or a portion of the stack. Thru-holes are generally formed prior to the formation of circuits on the exterior surfaces by drilling holes through the stack at appropriate locations. Following several pre-treatment steps, the walls of the holes are catalyzed by contact with a plating catalyst and metallized, typically by contact with an electroless or electrolytic copper plating solution to form conductive pathways between circuit layers. Following formation of the conductive thru-holes, exterior circuits, or outerlayers are formed using the procedure described above.

The necessity of developing ever-increasing high speed circuitized substrates for use in many of today's new products has led to the exploration of new materials to extend the electrical and thermal performance limits of the presently available technology. For high-speed applications, it is necessary to have extremely dense conductor circuitry patterning on low dielectric constant insulating material. Prepreg laminates for conventional circuit boards consist of a base reinforcing glass fabric impregnated with a resin, also referred to by some in the industry as "FR4" dielectric material. Epoxy/glass laminates used in some current products typically contain about 40% by weight fiberglass and 60% by weight epoxy resin.

Creating a small cavity in a buried resistor layer for wire bonding using a standard PTFE dielectric substrate can result in a fluorinated ethylene propylene resin (FEP) bleed problem from the substrates used to create the assembly.

It is a primary object of the invention to enhance the art of creating a fusion bonded small cavity in a buried resistor layer substrate.

It is another object of the invention to eliminate the FEP bleed problem while utilizing a wire bond process.

According to another object of the invention, there is provided a method of producing a wire bondable cavity substrate for RF components.

DISCUSSION OF RELATED ART

U.S. Pat. No. 5,923,952 by Ismail et al., issued Jul. 13, 1999 for FUSION-BOND ELECTRICAL FEED-THROUGH discloses a semiconductor device that has a flexible structure bonded to a semiconductor substructure to form a cavity. The flexible structure is bonded over a conducting feed-through without the feed-through interfering with a hermetic seal formed by bonding. One embodiment of the device includes depressions that contain edges of a diffused feed-through so that imperfections at the edge of the diffusion do not interfere with bonding. The flexible structure is bonded to elevated areas, thus hiding the imperfections. In one embodiment, a first elevated region is surrounded by a second elevated region, and diffusion for the feed-through extends from an active region in the cavity across the first elevated region with edges of the diffusion being between the first and second elevated regions. The flexible structure can thus bond to the first and second elevated regions without interference from the edge of the diffused feed-through. A via through the flexible structure to the first elevated region provides electrical contact with the active region. Another embodiment has either a surface or buried well in a semiconductor structure and extending from an active region in the cavity to a point outside the perimeter of the flexible structure. The well provides a conductive feed-through structure without creating imperfections that would interfere with the bonding that seals the cavity.

U.S. Pat. No. 7,260,890 by White et al., issued Aug. 28, 2007 for METHODS FOR FABRICATING THREE-DIMENSIONAL ALL ORGANIC INTERCONNECT STRUCTURES discloses a signal processing module that can be manufactured from a plurality of composite substrate layers, each substrate layer including elements of multiple individual processing modules. Surfaces of the layers are selectively metallized to form signal-processing elements when the substrate layers are fusion bonded in a stacked arrangement. Prior to bonding, the substrate layers are milled to form gaps located at regions between the processing modules. Prior to bonding, the leads are positioned to extend from signal coupling points on the metallized surfaces into the gap regions. The substrate layers are then fusion bonded to each other; the plurality of substrate layers form signal processing modules with leads that extend from an interior of the modules into the gap areas. The individual modules may then be separated by milling the substrate layers to de-panel the modules.

U.S. Pat. No. 7,297,875 by Lauriello, issued Nov. 20, 2007 for FUSION BONDED ASSEMBLY WITH ATTACHED LEADS discloses methods for making liquid crystalline polymer (LCP) interconnect structures using a high temperature and low temperature single sided LCP where both the high and low temperature LCP are drilled to form a z-axis connection. The single sided conductive layer is a bus layer to form z axis conductive stud within the high and low temperature LCP, followed by a metallic capping layer of the stud that serves as the bonding metal between the conductive interconnects to form the z-axis connection. High and low temperature LCP layers are etched or built up to form circuit patterns and subsequently bonded together to form final multilayer circuit patterns where the low temperature LCP melts to form both dielectric-to-dielectric bond to the high temperature LCP circuit layer, and dielectric-to-conductive bond, whereas metal to metal bonding occurs with high temperature metal capping layer bonding to the conductive metal layer.

The previously disclosed United States issued patents fail to adequately describe the present invention's elimination of the FEP resin bleed problem during the production of wire bondable cavity substrates for RF components.

SUMMARY OF THE INVENTION

According to the present invention, there is provided a method of creating a small cavity in a buried resistor layer for wire bonding while eliminating the FEP resin bleed problem that occurs from the dielectric substrates used to create the assembly.

BRIEF DESCRIPTION OF THE DRAWINGS

These and other features and advantages of this invention will be more readily understood from the following detailed description of the various aspects of the invention taken in conjunction with the accompanying drawings in which:

FIGS. 1 through 7 are sequential sectional views of a build-up of a small cavity in a buried resistor layer for wire bonding in accordance with the present invention.

Figure 4:
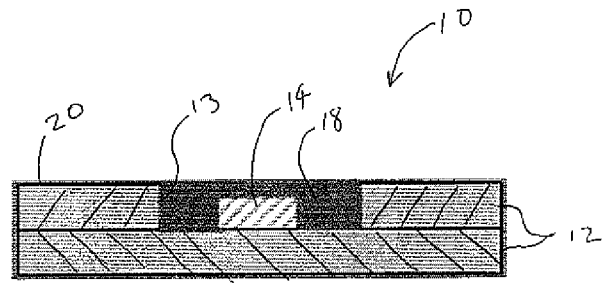

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. For the sake of clarity and brevity, like elements and components of each embodiment will bear the same designations throughout the description.

DESCRIPTION OF THE PREFERRED EMBODIMENT

The invention is a process for forming cavities on a buried resistor layer using fusion bonding. The process results in flexibility and strength, the benefit offered by fiber reinforced materials. Resins contained within the laminate are prevented from contributing to the FEP resin bleed problem.

For a better understanding of the present invention, together with other and further objects, advantages and capabilities thereof, reference is made to the following disclosure and appended claims.

By the term "circuitized substrate" as used herein is meant a substrate structure having at least one (and preferably more) dielectric layer and at least one external conductive layer positioned on the dielectric layer and including a plurality of conductor pads as part thereof. The dielectric layer(s) may be made of one or more of the following dielectric materials: fiberglass-reinforced epoxy resin ("FR-4"); polytetrafluoroethylene (e.g., Teflon), including polytetrafluoroethylene filled with inorganic particles (e.g., silica) as a means of controlling the coefficient of thermal expansion of the dielectric material; polyimide (e.g., Kapton); polyamide; cyanate resin; photo-imageable material; and other like materials. One example of such material known today is sold under the product name "RT/duroid® 5880LZ" by Rogers Corporation, Rogers, Conn. ("RT/duroid® 5880LZ" is a trademark of the Rogers Corporation.) The conductive layer(s) preferably serve to conduct electrical signals, including those of the high frequency type, and is preferably comprised of suitable metals such as copper, but may include or comprise additional metals (e.g., nickel, aluminum, etc.) or alloys thereof.

By the term "electroplating" as used herein is meant a process by which a metal in its ionic form is supplied with electrons to form a non-ionic coating on a desired substrate. The most common system involves: a chemical solution which contains the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal.

By the term "electroless plating" (also known as chemical or auto-catalytic plating) as used herein is meant a non-galvanic type of plating method that involves several simultaneous reactions in an aqueous solution, which occur without the use of external electrical power. The reaction is accomplished when hydrogen is released by a reducing agent, normally sodium hypophosphite, and oxidized thus producing a negative charge on the surface of the part.

By the term "electronic package" as used herein is meant a circuitized substrate assembly as taught herein having one or more ICs (e.g., semiconductor chips) positioned thereon and electrically coupled thereto. In a multi-chip electronic package, for example, a processor, a memory device and a logic chip may be utilized and oriented in a manner designed for minimizing the limitation of system operational speed caused by long connection paths. Some examples of such packages, including those with a single chip or a plurality thereof, are also referred to in the art as chip carriers.

By the term "fusion bonding" as used herein is meant the process of laminating dielectric layers together using heat and pressure only, wherein there is no need for a separate adhesive or paste to create the bond. The temperatures and pressures used for fusion are higher than that required when adhesives are used. The process of fusion bonding eliminates the need for a bond film or adhesive, and delamination or fracture of plated thru-holes can occur if the melt point of the adhesive is exceeded during soldering or testing. The fatigue failure of plated thru-holes in a multilayer PCB can occur during thermal cycling below the melt point of the adhesive due to the high thermal expansion of these films and adhesives.

By the term "laser ablation" as used herein is meant the process of removing material from a solid surface by irradiating it with a laser beam. At low laser flux, the material is heated by the absorbed laser energy and evaporates or sublimes. At high laser flux, the material is typically converted to a plasma. The term laser ablation as used herein refers to removing material with a pulsed laser as well as ablating material with a continuous wave laser beam if the laser intensity is high enough.

By the term "Kapton" as used herein is meant a polyimide material currently available from E.I. du Pont de Nemours & Company (hereinafter also referred to simply as "du Pont") of Wilmington, Del., and sold under this product name. Kapton is a registered trademark of du Pont.

By the term "thru-hole" as used herein is meant to include what are also commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated thru-holes" (also known as PTHs), which typically extend through the entire thickness of a substrate. All of these various openings form electrical paths through the substrate and often include one or more conductive layers, e.g., plated copper, thereon. Alternatively, such openings may simply include a quantity of conductive paste or, still further, the paste can be additional to plated metal on the opening sidewalls. These openings in the substrate are formed typically using mechanical drilling or laser ablation, following which the plating and/or conductive paste may be added.

Other definitions are readily ascertainable from the detailed descriptions provided herein.

A particular use for the individual dielectric layers formed using this invention is to become parts of circuitized substrates such as chip carriers or PCBs or other electronic packaging products, including those produced and sold by the Assignee of this invention, Endicott Interconnect Technologies, Inc. The invention is of course not limited to chip carriers or even to higher-level PCBs. It is also understood that such dielectric layers may be used to form what are referred to in the substrate art as "cores," a specific example being a "power core" if the core includes one or more power planes and is thus to serve primarily in this capacity. Like other conductive-dielectric layered substrates, such cores may in turn be stacked up with other layers, including conductors and dielectrics, and bonded together, preferably using conventional PCB lamination processing, to form a multilayered carrier or multilayered PCB. As also mentioned above, the laminate so formed is then subjected to further processing, including conventional photolithographic processing, to form circuit patterns on the outer conductive layers thereof. Such external patterns can include conductive pads on which conductors such as solder balls can be positioned to connect the structure to other components such as semiconductor chips, PCBs and chip carriers if so desired. The unique teachings of this invention are thus adaptable to myriad electronic packaging products.

Referring now to FIGS. 1a-d, the basic structure of a buried resistor layer 10 contains a layer of glass microfiber impregnated dielectric 12, which is further processed by adding thru-holes 13 by laser drilling or mechanical drilling, as known in the art, and a second dielectric layer 12 that is processed by removing a portion of the copper cladding or foil conductor using a photosensitive film applied to the metal coating 11. Pursuant to the invention, the coating 11 is then exposed to patterned activating radiation and developed. An etchant, not shown, is then used to remove copper bared by the development of the photosensitive film. Finally, the remaining photosensitive film is removed to provide the circuit trace that, in this case, is a resistor core 14. The removal of copper cladding to create a trace can also be accomplished by the addition of metal to the dielectric. The description of removing the cladding here is not meant to be limiting of the invention.

Referring now to FIG. 2, there is shown a laminated structure of the buried resistor layer 10 containing a first dielectric layer 12 with thru-hole 13 that is fusion bonded 16 with the second dielectric layer 12 that contains the resistor core 14, positioned so that the resistor core 14 is located within the constraints of thru-hole 13 of the first layer 12.

Figure 5:
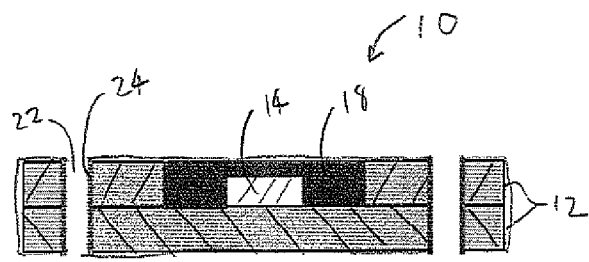

Referring now to FIGS. 3 through 5, the laminate structure of buried resistor layer 10 is further processed by adding a soldermask 18 to fill the space surrounding resistor 14 within thru-hole 13. A seed and strike layer of copper 20 is applied to protect the soldermask 18 during subsequent plasma and reactive ion etch (RIE) procedures required to clean the thru-holes 22. Thru-holes 22 are drilled in the dielectric layers 12 and are cleaned with an RIE plasma process and an acid etch to clean thru-holes 22 prior to plating to form plated thru-holes (PTHs) 24. As described hereinabove, thru-holes 22 are created by laser or mechanical drilling and plated 24 using an electroplating or an electroless plating procedure.

Figure 6:
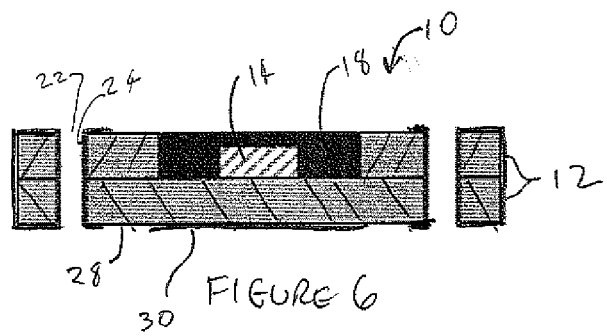

Referring now to FIG. 6, the laminate structure of buried resistor layer 10 is further processed by being photocircuitized and using subtractive etching of the copper layer 20 using processes well known in the art. After the copper layer 20 is etched, what remains are circuit traces 30 and land areas 28 that do not contain copper.

Figure 7:
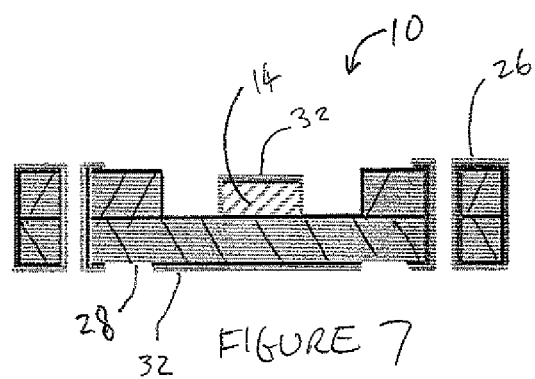

Referring now to FIG. 7, there is shown buried resistor layer 10 that has been processed to remove the soldermask 18 to expose the resistor core 14. A plating of gold 32 is applied to the exposed circuit traces 30 and PTHs 24, and also to exposed copper resistor core 14 that will facilitate the wire bond connections required of the subsequent assembly build up steps this buried resistor layer 10 will be contained in. A last step, not shown, is the removal of individual subassemblies from a larger mass produced board that contains multiple copies of the sub-assembly, is accomplished using a laser to trim the boundaries of each subassembly to allow easy removal from the larger board.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method of forming a buried resistor within a cavity for use in electronic packages, the steps comprising:
   a) providing a first glass impregnated dielectric layer having an upper surface and a first lower surface;
   b) forming a clearance hole in said first glass impregnated dielectric layer;
   c) providing a second glass impregnated dielectric layer having an upper copper coated surface and a second lower surface;
   d) removing a portion of said upper copper coated surface of said second dielectric layer, creating a resistor core on said upper copper coated surface;
   e) disposing said first dielectric layer on said upper copper coated surface of said second dielectric layer; and
   f) fusion bonding all of said layers together, forming a first subassembly, wherein said clearance hole in said first layer of said dielectric layer surrounds said resistor core on said upper copper coated surface.

2. The method of forming a buried resistor within a cavity for use in electronic packages as in claim 1, the steps further comprising:
   g) disposing soldermask material in said clearance hole;
   h) disposing a first layer of copper on said first subassembly;
   i) forming thru-holes in said first subassembly;
   j) cleaning said thru-holes using at least one from the group: reactive ion etch (RIE) plasma; and an acid etchant solution;
   k) disposing a second layer of copper in said thru-holes;
   l) disposing photoimageable material on top and bottom surfaces of said first subassembly;
   m) exposing said photoimageable material and subtractive etching from said first subassembly a pattern in said first layer of copper;
   n) removing said soldermask material; and
   o) disposing a layer of gold plating onto said first subassembly said first and said second layers of copper.

3. The method of forming a buried resistor within a cavity as in claim 1, wherein said dielectric layers comprise RT/duroid® 5880LZ material.

4. The method of forming a buried resistor within a cavity as in claim 2, wherein said cleaning step (j) further comprises pre-plating said thru-holes by a conventional cleaning process and disposing a seed copper layer therein.

5. The method of forming a buried resistor within a cavity as in claim 1, wherein said fusion bonding of said first and said second layers of dielectric comprise the use of heat and pressure to laminate said dielectric layers together.

6. The method of forming a buried resistor within a cavity as in claim 1, wherein said forming said clearance hole step (b) is accomplished by using at least one type of laser from the group: UV, IR, and Nd-YAG.

7. The method of forming a buried resistor within a cavity as in claim 2, wherein said forming said thru-hole step (i) is accomplished by using at least one type of laser from the group: UV, IR, and Nd-YAG.

8. The method of forming a buried resistor within a cavity as in claim 2, wherein said etching a pattern step (m) comprises etching a pattern from at least one of the group: signal, power plane, and ground plane.

9. The method of forming a buried resistor within a cavity as in claim 2, wherein said disposing gold plating step (o) creates a surface amenable to wire bonding.

10. The method of forming a buried resistor within a cavity as in claim 1, wherein said fusion bonding is performed at a temperature of approximately 370 degrees C. and a pressure of approximately 500 psi.

11. A buried resistor within a cavity for use in electronic packages comprising:
    a circuitized substrate including a first glass impregnated dielectric layer having a plurality of clearance holes and a second glass impregnated dielectric layer having a plurality of resistor cores located thereon, selected ones of said resistor cores concentered within said clearance holes and being fusion bonded creating a first subassembly; and
    at least one resistor core of the plurality of resistor cores having metal plating disposed thereon, said circuitized substrate including a plurality of electrically conductive thru-holes located therein, an outer surface of said first subassembly having an etched copper coating disposed thereon.

12. The buried resistor within a cavity for use in electronic packages of claim 11, wherein said metal plating is gold.

13. The buried resistor within a cavity for use in electronic packages of claim 11, wherein said first and said second dielectric layers comprise RT/duroid® 5880LZ material.

14. The buried resistor within a cavity for use in electronic packages of claim 11, wherein said cleaning further comprises pre-plating said thru-holes by a conventional cleaning process and disposing a seed copper layer therein.

15. The buried resistor within a cavity for use in electronic packages of claim 11, wherein said etched copper coating comprises a pattern of at least one of the group: signal, power plane, and ground plane.

16. The buried resistor within a cavity for use in electronic packages of claim 12, wherein said gold plating comprises a surface amenable to wire bonding.

* * * * *